United States Patent [19]
Konrad

[11] Patent Number: 5,128,611
[45] Date of Patent: Jul. 7, 1992

[54] ELECTRONIC ELECTRICITY METER

[75] Inventor: Bernhard Konrad, Wetzikon, Switzerland

[73] Assignee: Zellweger Uster AG, Uster, Switzerland

[21] Appl. No.: 489,506

[22] Filed: Mar. 7, 1990

[30] Foreign Application Priority Data

Mar. 7, 1989 [CH] Switzerland .................. 00839/89
Nov. 3, 1989 [CH] Switzerland .................. 03973/89

[51] Int. Cl.⁵ .......................................... G01R 21/06
[52] U.S. Cl. ........................... 324/142; 324/127; 324/132; 364/483
[58] Field of Search ............. 324/142, 117 R, 117 H, 324/103 R, 140, 141, 115, 132, 74; 364/483, 487; 340/870.02, 870.03, 870.04, 657, 664, 650

[56] References Cited

U.S. PATENT DOCUMENTS

| | | | |
|---|---|---|---|
| 3,226,641 | 12/1965 | Miller | 324/142 |
| 3,546,565 | 12/1970 | Downing, Jr. et al. | 324/127 |
| 3,775,683 | 11/1973 | Barta et al. | 324/142 |
| 4,182,983 | 1/1980 | Heinrich et al. | 324/142 |
| 4,413,230 | 11/1983 | Miller | 324/142 |
| 4,459,546 | 7/1984 | Arrington et al. | 324/142 |
| 4,578,639 | 3/1986 | Miller | 324/142 |
| 4,837,504 | 6/1989 | Baer et al. | 324/142 |
| 4,859,937 | 8/1989 | Milkovic | 324/142 |
| 4,931,725 | 6/1990 | Hutt et al. | 324/142 |

FOREIGN PATENT DOCUMENTS 0201019 12/1986 European Pat. Off. .

Primary Examiner—Vinh Nguyen
Attorney, Agent, or Firm—Burns, Doane, Swecker & Mathis

[57] ABSTRACT

A meter includes a measuring part (1) and an evaluating part (2). The measuring part (1) contains an open magnetic current transformer (3) of the unloaded transformer type and an integrator (6) connected downstream of the transformer. As a result, no measuring errors caused by saturation occur in the transformer, and the metering of consumption is frequency-independent.

12 Claims, 2 Drawing Sheets

ELECTRONIC ELECTRICITY METER

The present invention relates to an electronic electricity meter for measuring the consumption of electric energy, with a measuring part, containing a magnetic current transformer, and with an evaluating part.

For determining consumption of electric energy it is known that it is necessary to measure the conductor currents ahead of the respective load, the variables of particular interest being the absolute value and phase of the fundamental wave and of a few harmonics.

The direct measurement of the currents by means of a shunt, which in itself seems obvious, is not possible in multiphase systems, since the difference in potential of the shunts of the various phases (line-to-line system voltage) is too great for the electronics of the solidstate electricity meter to handle Measurement by conventional current transformers is likewise disadvantageous because, if there is a diode in the load installation, a direct current circulates through the transformer and, if there is no air gap, saturates the said transformer. This saturation, however, leads to impermissible errors in measuring the energy consumed by the customer.

This saturation can be prevented by an air gap in the core of the transformer, which leads however to unacceptably large dimensions of the transformer. The accuracy demanded of the transformer can only be achieved if the leakage impedance of the transformer is minute in comparison with its magnetization impedance.

It is known from U.S. Pat. No. 3,546,565 to avoid the said undesired saturation of the core by incorporating an air gap and to compensate for the resulting drop in the magnetization impedance by a capacitor. However, since the capacitive resistance is frequency-dependent, such an electricity meter can only ever meter a certain current component correctly, that is the fundamental wave, but meters the harmonics incorrectly. This known solution is therefore disadvantageous.

The invention is now intended to provide an electricity meter in which no impermissible measuring errors caused by saturation occur in its magnetic transformer, and which also permits an exact metering of consumption at different frequencies.

According to the invention, this object is achieved by an open current transformer which has an air gap and is of the unloaded transformer type being provided, and by an integration stage being connected downstream of the said transformer.

The solution according to the invention thus includes an unloaded, magnetic current transformer, in which no saturation of the core occurs due to the primary-circulating current. A signal dI/dt, from which the integrator determines the current I, is obtainable at the output of the current transformer.

A preferred embodiment of the electricity meter according to the invention is characterized in that the evaluating part has a microcomputer, in which a scale dimensioning of the output signal of the measuring part is performed with allowance made for the characteristic time constant of the integration stage.

It is known that one of the characteristics of integrators is that their characteristic time constants are subject to strong fluctuations due to temperature changes and aging. In this respect, the capacitors used are very critical elements in particular, the stabilization of which to the required accuracy causes high costs. This problem of the long-term accuracy of analogue integrators is solved in a simple way by the allowance made by the invention for the characteristic time constant of the integrator in the scale dimensioning of the signal of the measuring part.

A further preferred embodiment of the electricity meter according to the invention is characterized in that a reference value for the output signal of the measuring part, obtained by means of a defined reference voltage applied to the integration stage over a defined time, is stored in the evaluating part, and in that the scaling factor for the said scale dimensioning can be derived from the ratio between this reference value and a calibration value obtained during operation of the electricity meter.

The invention is explained in more detail below with reference to exemplary embodiments and the drawings, in which.

Figure 1:
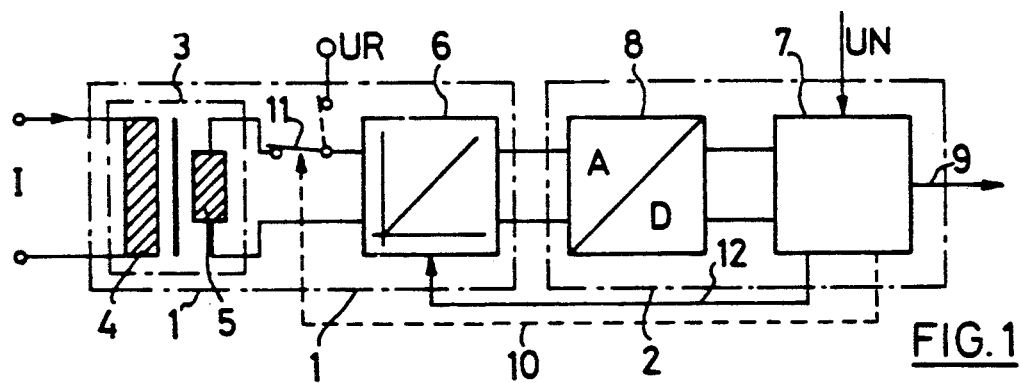
FIG. 1 shows a block diagram of a first exemplary embodiment of the parts essential for the invention of an electricity meter.

FIG. 1 shows a section taken from a static electricity meter, consisting of a measuring part 1 and of an evaluating part 2. The measuring part 1 contains a magnetic current sensor 3, with which conductor currents can be determined in a potential-free manner. Since it is not possible to measure directly by means of a current transformer on account of the direct-current component in the load current, the current sensor consists of a linear reactance coil 4, through which the load current I flows, and of an auxiliary winding 5, in which a voltage is induced by the coil 4.

The voltage induced in the auxiliary winding 5 is fed through an analogue integrator 6, in which a current-proportional voltage is generated by integration of the said induced voltage. This current-proportional voltage is processed further as a transformed current signal. The actual measurement is performed in a microcomputer 7 with upstream analogue/digital converter 8. Consequently, a current signal or a variable derived therefrom, such as energy or power, is obtainable at the output 9 of the microcomputer 7. UN denotes the load voltage fed to the microcomputer 7.

A solid-state electricity meter with an electronic measuring unit is described in EP-A-0 201 019, which meter has a microcomputer for signal processing with allowance for correction values for the various elements of the circuit. In this case, the correction values in each case represent an integral value for the measuring range concerned and are included in meter parameters stored in the meter, each of which represents a numerical value corresponding to a defined quantity of energy. Reference is hereby made expressly to the disclosure of this EP-A.

In the case of the known electricity meter according to EP-A-0 201 109, the measuring part 1 represented in FIG. 1 of the present patent application, with the current sensor 3 and the integrator 6, would form a component part of its input module 1 (FIG. 1), the function of the microcomputer 7 would preferably be taken over by the microcomputer 8 (FIG. 1) of this known electricity meter.

As already mentioned, the characteristic time constants of analogue integrators of the type of the integrator 6 are subject to strong fluctuations, which are caused by temperature changes and aging. Therefore, such integrators can only be used meaningfully in practice if their characteristic time constants are checked at the requisite intervals and if care is taken to ensure that any changes and fluctuations cannot falsify the measurement result. Usually, the latter would be performed by a corresponding re-adjustment of the integrator; in the case of the present electricity meter, the following procedure for this is proposed:

During operation of the electricity meter, the integrator time constant is measured and used for scaling, that is to say for scale dimensioning or scale weighting., of the current signal or of the variable derived therefrom, such as for example energy or power. This means in other words that, in the calculation of the energy consumed from the transmission value of the signal passed to it, the microcomputer 7 multiplies this transmission value by a "scaling factor", obtained on the basis of the measurement of the integration time constant, and thereby compensates for any fluctuations in the integrator time constant. Thus, a continuing self-calibration takes place during the operation of the electricity meter.

In practice, this self-calibration is performed by, on the one hand, a switch 11 being switched over via a line 10 from the position drawn in solid lines into the position shown in broken lines and, on the other hand, (line 12) the output of the integrator 6 being set to zero, by a suitable control, preferably by the microcomputer 7. By the operation of the switch 11, instead of the induced voltage of the auxiliary winding 5, a reference direct voltage UR is applied to the input of the integrator 6, as a result of which the voltage at the integrator output increases in ramp form After a defined time, this voltage is measured and a calibration value obtained as a result, it being possible if need be, for the elimination of faults, to carry out a plurality of measurements with averaging. The calibration value is then compared with a reference value, measured in the same way under calibration conditions and archived, preferably stored in the microcomputer 7. This comparison directly yields the scaling factor already mentioned.

The calibration operation described is initiated by the microcomputer 7 itself at relatively long intervals of, for example, days or weeks. It takes only a few seconds in each case, meaning that the operation of the electricity meter is not affected.

Figure 2:
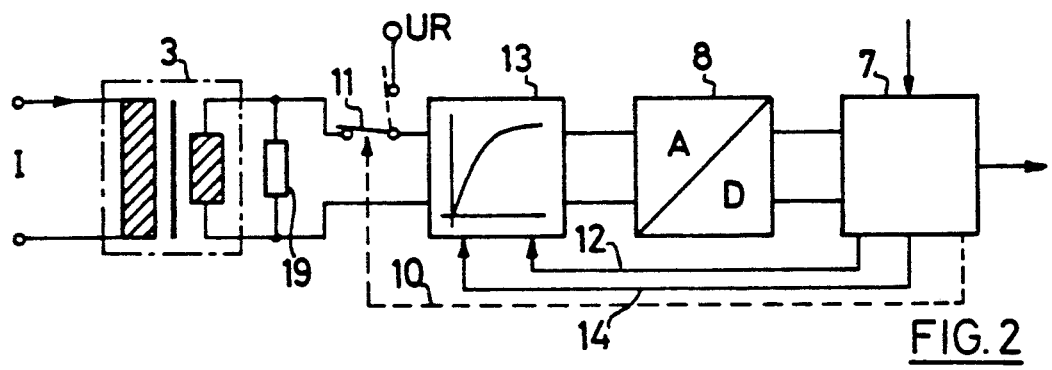
FIG. 2 shows a detailed variant of the block diagram of FIG. 1.
Figure 3:
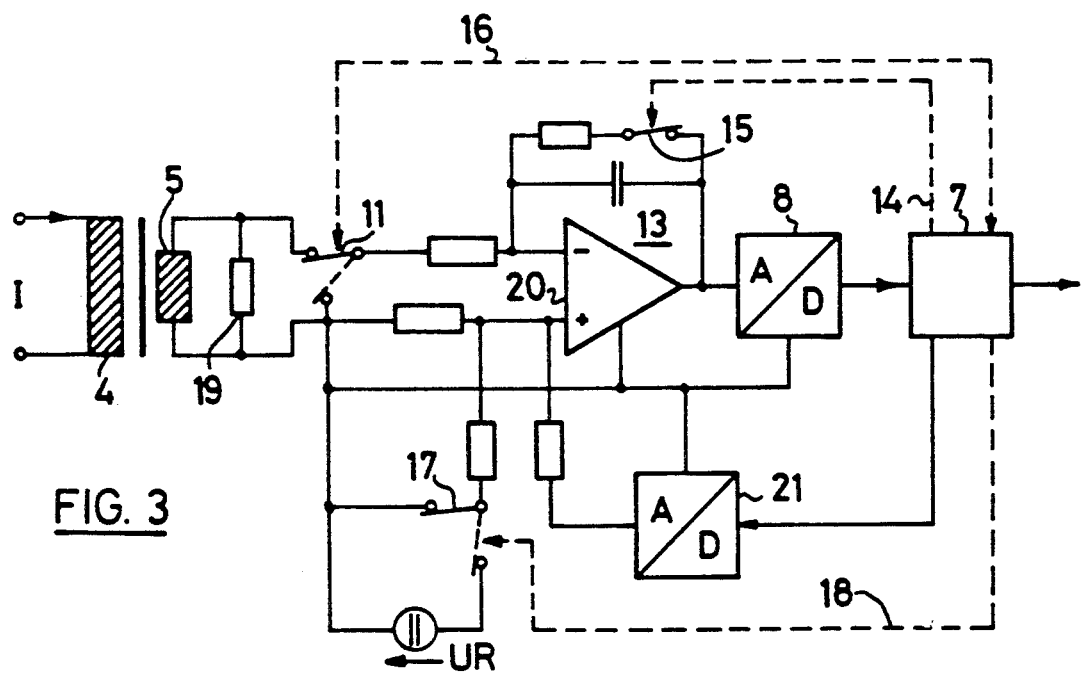
FIG. 3 shows the example of FIG. 2, in somewhat more detail.

In the case of the variant represented in FIGS. 2 and 3, instead of an ideal integrator 6, a low-pass filter 13 with low limiting frequency is used. This alleviates the problems which may result from possible input offset voltages of the amplifier element in the integrator. However, for the calibrating operation, the low-pass filter 13 must be wired as an ideal integrator, which is performed by opening a switch 15 (FIG. 3) which can be operated via a control line 14. The other operations in the calibration proceed in a similar way to that already described disconnection of the low-pass filter 13 from the auxiliary winding 5 by a switch 11 and control line 16 (FIG. 3), and application of the reference voltage UR by a switch 17 and control line 18.

By weak loading of the auxiliary winding 5 with a high-valued resistor 19 (FIGS. 2, 3), a bandpass characteristic of the measuring circuit can be produced. This has the advantage of attenuating higher-frequency components in the input current and thereby reduces the requirements on the low-pass amplifier 20. Furthermore, for the additional correction of offset voltages, an offset correction signal can be added at the input of the low-pass amplifier by the microcomputer 7 via a digital/ analogue converter 21.

Figure 4:
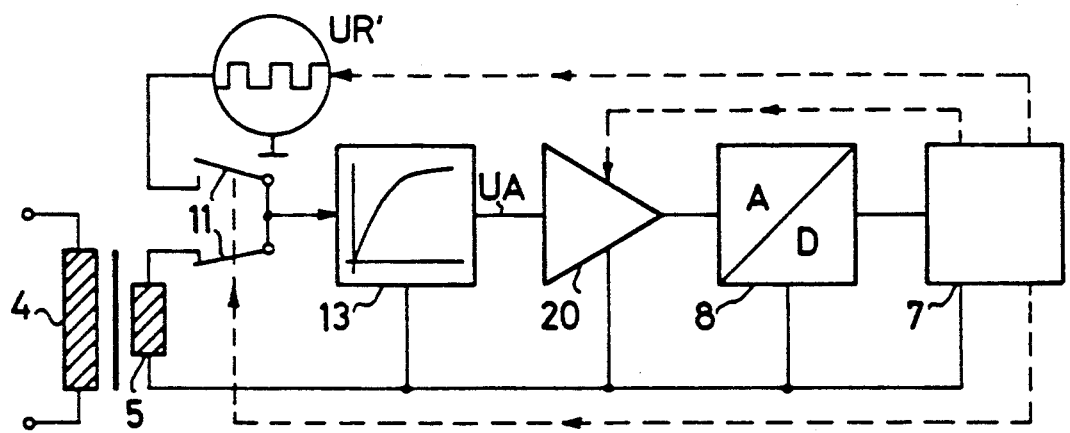
FIG. 4 shows a diagram of a second exemplary embodiment.
Figure 5:
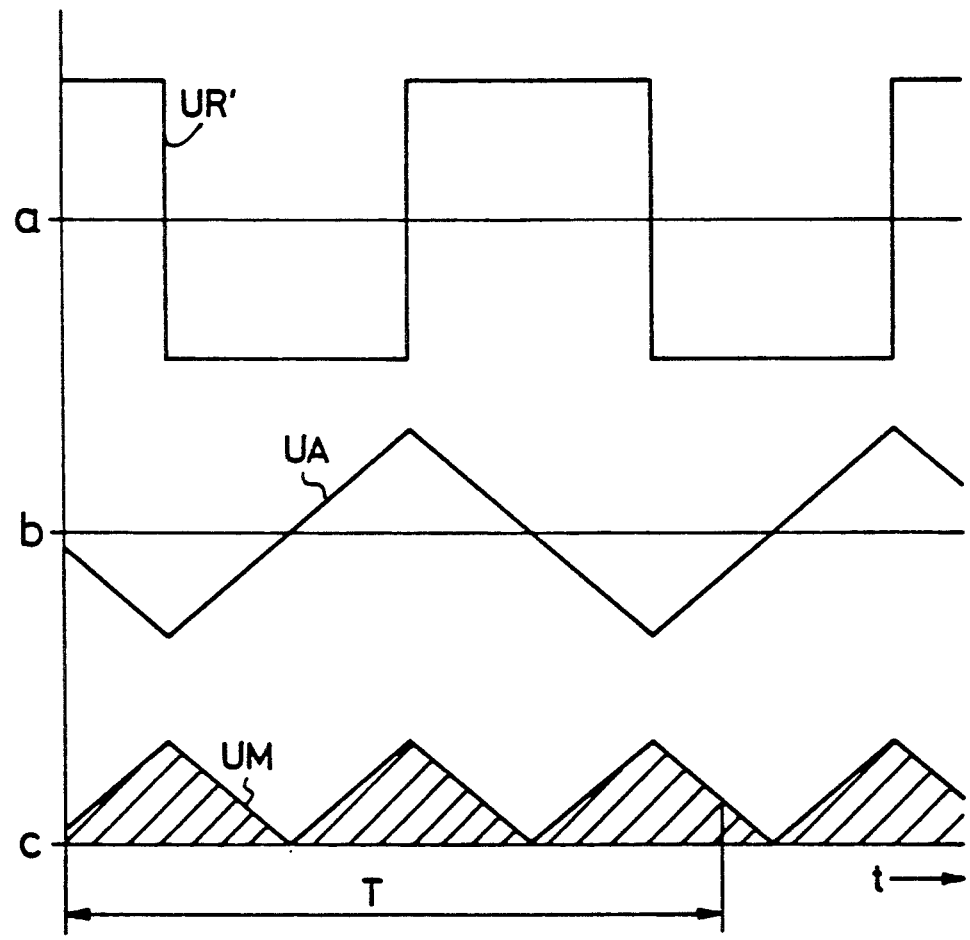
FIG. 5 shows a diagram for functional explanation

Another variant consists in using an alternating voltage UR' instead of a direct voltage UR as reference voltage for the calibration. This variant is represented in FIGS. 4 and 5. As in the case of the other exemplary embodiments as well, by shifting the switch 11, the regular input signal is disconnected from the input of the low-pass filter 13 and instead the reference alternating voltage UR' is applied (cf. FIG. 5, line a); at the output of the low-pass filter 13, an alternating voltage UA is generated (FIG. 5, line b), the effective value of which, or more advantageously its rectified average value UM (FIG. 5, line c), is measured over a certain period of time T. A comparison of the result of this measurement with a reference value measured in the same way during calibration and archived supplies a value which is directly proportional to the change in the measuring constant of the measuring part. In analogy to FIG. 1, measuring part here refers to the current measuring circuit consisting of reactance coil 4 with auxiliary winding 5 (current sensor 3) and of the low-pass filter 13. Measuring constant refers to the ratio of amplitudes between output voltage and input voltage at the low-pass filter 13.

To reduce the complexity of the circuitry, the reference direct voltage of the analogue/digital converter 8, available in any case, may be used as reference alternating voltage UR, by it being alternately applied positively and negatively to the input-of the low-pass filter 13 by means of analogue switches.

I claim:

1. Electronic electricity meter for measuring the consumption of electric energy comprising a measuring part having a magnetic current sensor, and an evaluating part for processing an output signal from the measuring part and determining an amount of electric energy consumed, characterized in that the magnetic current sensor comprises a transformer (3) which has an air gap and is of the unloaded transformer type and in that the measuring part further comprises an integration state (6, 13) connected downstream of said transformer and in that the evaluating part includes a microcomputer in which a scale dimensioning of the output signal from the measuring part is performed with allowance made for a characteristic time constant of the integration stage (6, 13).

2. Electricity meter according to claim 1, characterized in that a reference value for the output signal of the measuring part (1) is obtained from a defined reference voltage applied to an input of the integration stage (6, 13) over a defined time, and in that the reference value is stored in the evaluating part (2), and in that a scaling factor for said scale dimensioning is derived from a comparison of the reference value and a calibration value obtained during operation by applying the defined reference voltage to the input of the integration stage over the defined time.

3. Electricity meter according to claim 2, characterized in that the integration stage is formed by an RC element.

4. The electricity meter of claim 3 wherein said RC element comprises a low-pass filter.

5. Electricity meter according to claim 4, characterized in that, for the calibration operation, the low-pass filter (13) is wired as an ideal integrator.

6. Electricity meter according to claim 4, characterized in that the current transformer (3) is formed by a linear reactance coil (4), through which the load current (I) flows, and an auxiliary winding (5) assigned to the said reactance coil, and in that the voltage induced in the auxiliary winding forms the input signal of the integration stage (6, 13).

7. Electricity meter according to claim 6, characterized in that the auxiliary winding (5) is loaded by a high-valued resistor (19).

8. Electricity meter according to claim 2 characterized in that the reference voltage is formed by a direct voltage (UR).

9. Electricity meter according to claim 2, characterized in that the current transformer is formed by a linear reactance coil, through which a load current flows, and an auxiliary winding assigned to the said reactance coil, and in that a voltage induced in the auxiliary winding forms the input signal of the integration stage.

10. Electricity meter according to claim 2, characterized in that the integration stage is formed by an operational amplifier.

11. Electricity meter according to claim 2, characterized in that the defined reference voltage (UR') is an alternating voltage, and in that effective value or a rectified average value (UM) of an output signal from the integration stage (13) is measured at the output of the measuring part (1).

12. Electricity meter according to claim 2, characterized in that the defined reference voltage (UR') is a reference direct voltage of an analogue/digital converter (8) connected upstream of the microcomputer, and the defined reference voltage (UR') is alternately applied positively and negatively to the input of the integration stage.

* * * * *